United States Patent
Lee et al.

(10) Patent No.: US 8,866,376 B2
(45) Date of Patent: Oct. 21, 2014

(54) LIGHT EMITTING DEVICE PACKAGE AND MANUFACTURING METHOD THEREOF

(75) Inventors: Dong Yeoul Lee, Hwaseong-si (KR); Kyeong Ik Min, Suwon-si (KR); Chang Sub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/414,179

(22) Filed: Mar. 7, 2012

(65) Prior Publication Data

US 2012/0236568 A1  Sep. 20, 2012

(30) Foreign Application Priority Data

Mar. 14, 2011  (KR) ................. 10-2011-0022367

(51) Int. Cl.
| | |
|---|---|
| H05K 7/20 | (2006.01) |
| H05K 3/30 | (2006.01) |
| F21V 29/00 | (2006.01) |
| H01L 33/60 | (2010.01) |
| H01L 33/64 | (2010.01) |

(52) U.S. Cl.
CPC ............. *H01L 33/642* (2013.01); *H01L 33/647* (2013.01); *H01L 33/60* (2013.01)
USPC ............ 313/503; 313/502; 313/504; 362/294

(58) Field of Classification Search
CPC ...................................................... H01L 33/60
USPC ............................ 313/500–512; 362/294, 538
See application file for complete search history.

(56) References Cited

U.S. PATENT DOCUMENTS

| | | | |
|---|---|---|---|
| 6,525,942 B2 * | 2/2003 | Huang et al. | 361/704 |
| 7,710,016 B2 * | 5/2010 | Miki et al. | 313/502 |

(Continued)

FOREIGN PATENT DOCUMENTS

| | | |
|---|---|---|
| JP | 2001-297603 A | 10/2001 |
| JP | 2005-209763 A | 8/2005 |

(Continued)

OTHER PUBLICATIONS

Japanese Office Action issued in Japanese Patent Application No. 2012-057588 dated Jun. 25, 2013.

(Continued)

*Primary Examiner* — Anh T. Mai
*Assistant Examiner* — Elmito Breval
(74) *Attorney, Agent, or Firm* — McDermott Will & Emery LLP

(57) ABSTRACT

A light emitting device (LED) package and a manufacturing method thereof are provided. The LED package includes a circuit board comprising at least one device region, a plurality of electrode regions, at least one first thermal via exposed through upper and lower surfaces of the at least one device region, and a plurality of second thermal vias exposed through upper and lower surfaces of the plurality of electrode regions; at least one first thermal pad bonded to the upper surface of the at least one device region and connected to the first thermal via; at least one LED mounted on the at least one first thermal pad; a plurality of first electrode pads bonded to the upper surface of the electrode region and connected to the second thermal vias; and a plurality of wires to connect the at least one LED with the plurality of first electrode pads.

9 Claims, 5 Drawing Sheets

(56) References Cited

U.S. PATENT DOCUMENTS

| | | | |
|---|---|---|---|
| 2005/0122018 A1* | 6/2005 | Morris | 313/46 |
| 2006/0255355 A1* | 11/2006 | Brunner et al. | 257/98 |
| 2008/0099770 A1* | 5/2008 | Mendendorp et al. | 257/79 |
| 2008/0261339 A1 | 10/2008 | Koung et al. | |
| 2009/0273002 A1* | 11/2009 | Chiou et al. | 257/99 |
| 2010/0195322 A1* | 8/2010 | Kawakami et al. | 362/231 |
| 2011/0116275 A1* | 5/2011 | Sheek | 362/382 |

FOREIGN PATENT DOCUMENTS

| | | |
|---|---|---|
| JP | 2006-041230 A | 2/2006 |
| JP | 2007-173369 A | 7/2007 |
| JP | 2007273592 A | 10/2007 |
| JP | 2009-117536 | 5/2009 |
| JP | 2009164311 A | 7/2009 |
| KR | 10-2010-0002663 A | 1/2010 |
| WO | 2005029597 A1 | 3/2005 |

OTHER PUBLICATIONS

Notice of Final Rejection Japanese Patent Application No. 2012-057588 dated Oct. 15, 2013.

* cited by examiner

LIGHT EMITTING DEVICE PACKAGE AND MANUFACTURING METHOD THEREOF

CROSS-REFERENCE TO RELATED APPLICATION

This application claims the benefit of Korean Patent Application No. 10-2011-0022367, filed on Mar. 14, 2011, in the Korean Intellectual Property Office, the disclosure of which is incorporated herein by reference.

BACKGROUND

1. Field

The present invention relates to a light emitting device (LED) package and a manufacturing method thereof, capable of achieving high performance efficiency and heat radiation efficiency.

2. Description of the Related Art

A light emitting device (LED) refers to a semiconductor device to convert electrical energy into optical energy. The LED consists of compound semiconductor materials that generate light of a particular wavelength according to an energy band gap. Use of the LED is expanding from optical communication, a display device such as a mobile display and a computer monitor, and a flat light source for a liquid crystal display (LCD), even to general lighting devices.

In general, the LED is manufactured in a package form. For example, a lead frame type LED package may include a package mold having a molding material filling a space formed by connection of a pair of lead frames, an LED mounted on the lead frames disposed in the package mold, a wire connecting the LED with the lead frames, and a molding material filling the package mold to protect the LED and a part of the wire.

According to another example, a flip chip type LED package includes a flip chip LED bonded to a ceramic substrate including an electrode, and a molding material filling an upper part of the LED.

Heat radiation efficiency of the lead frame type LED package is relatively low since light is emitted through the lead frames. In case of the flip chip type LED package, the manufacturing of the LED is complicated. Also, marketability is low due to a high material cost.

SUMMARY

According to an embodiment of the present invention, there may be provided a light emitting device (LED) package and a manufacturing method thereof, capable of efficiently radiating heat generated from an LED, by forming at least one first thermal via in a device region of a circuit board and forming a plurality of second thermal vias on an electrode region of the circuit board.

According to an embodiment of the present invention, there may be also provided an LED package and a manufacturing method thereof, capable of increasing efficiency of extracting light generated from an LED, by forming a first thermal pad in a device region of a circuit board and forming a reflection metal layer on a surface of the first thermal pad.

According to an embodiment of the present invention, there may be also provided an LED package and a manufacturing method thereof, capable of reducing manufacturing cost by connecting an LED with a first electrode pad by wire-bonding.

The foregoing and/or other aspects are achieved by providing a light emitting device (LED) package including a circuit board comprising at least one device region, a plurality of electrode regions, at least one first thermal via exposed through an upper surface and a lower surface of the at least one device region, and a plurality of second thermal vias exposed through upper surfaces and lower surfaces of the plurality of electrode regions; at least one first thermal pad bonded to the upper surface of the at least one device region and connected to the at least one first thermal via; at least one LED mounted on the at least one first thermal pad; a plurality of first electrode pads bonded to the upper surface of the electrode region and connected to the plurality of second thermal vias; and a plurality of wires to electrically connect the at least one LED with the plurality of first electrode pads.

The LED package may further include at least one second thermal pad bonded to the lower surface of the at least one device region and connected to the at least one first thermal via; and a plurality of second electrode pads bonded to lower surfaces of the plurality of electrode regions and connected to the plurality of second thermal vias.

The at least one first thermal via, the plurality of second thermal vias, the at least one first thermal pad, the at least one second thermal pad, the plurality of first electrode pads, and the plurality of second electrode pads may be made of at least one of aluminum (Al), copper (Cu), molybdenum (Mo), tungsten (W), silver (Ag), and solder.

The LED package may further include a reflection metal layer coating a surface of the at least one first thermal pad.

The reflection metal layer may have a thickness in the range of about 0.1 mm to 30 mm.

The reflection metal layer may be made of any one selected from gold (Au), Ag, and platinum (Pt).

The at least one LED is a blue LED emitting light in a blue wavelength range.

The LED package may further include a phosphor layer disposed on the at least one LED, containing a yellow phosphor; and a molding unit disposed on the phosphor layer.

The circuit board may be any one selected from a metal core printed circuit board (PCB) and an FR4 substrate.

The foregoing and/or other aspects are achieved by providing a method of manufacturing a light emitting device (LED), the method including preparing a circuit board comprising at least one device region, a plurality of electrode regions, at least one first thermal via exposed through an upper surface and a lower surface of the at least one device region, and a plurality of second thermal vias exposed through upper surfaces and lower surfaces of the plurality of electrode regions; forming at least one first thermal pad on the upper surface of the at least one device region to be connected to the at least one first thermal via; forming a plurality of first electrode pads on the upper surface of the electrode region to be connected to the plurality of second thermal vias; mounting at least one LED on the at least one first thermal pad; and wire-bonding so that the at least one LED is electrically connected with the plurality of first electrode pads.

The preparing of the circuit board may include forming at least one first via hole on the at least one device region of the circuit board; forming a plurality of second via holes on the plurality of electrode regions of the circuit board; forming the at least one first thermal via by filling a metal material in the at least one first via hole; and forming the plurality of second thermal vias by filling a metal material in the plurality of second via holes.

The method may further include forming at least one second thermal pad on the lower surface of the at least one device region to be connected to the at least one thermal via; and forming a plurality of second electrode pads on lower surfaces of the plurality of electrode regions to be connected to the plurality of second thermal vias.

The method may further include forming a reflection metal layer by coating a surface of the at least one first thermal pad with a metal material.

The forming of the reflection metal layer may coat the surface of the at least one first thermal pad with the metal material having thickness in the range of about 0.1 mm to 30 mm.

The at least one LED may be a blue LED emitting light in a blue wavelength range.

The method may further include applying a phosphor resin containing a yellow phosphor on an upper part of the at least one LED; and applying a molding resin on the phosphor resin.

Additional aspects, features, and/or advantages of embodiments of the present invention will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
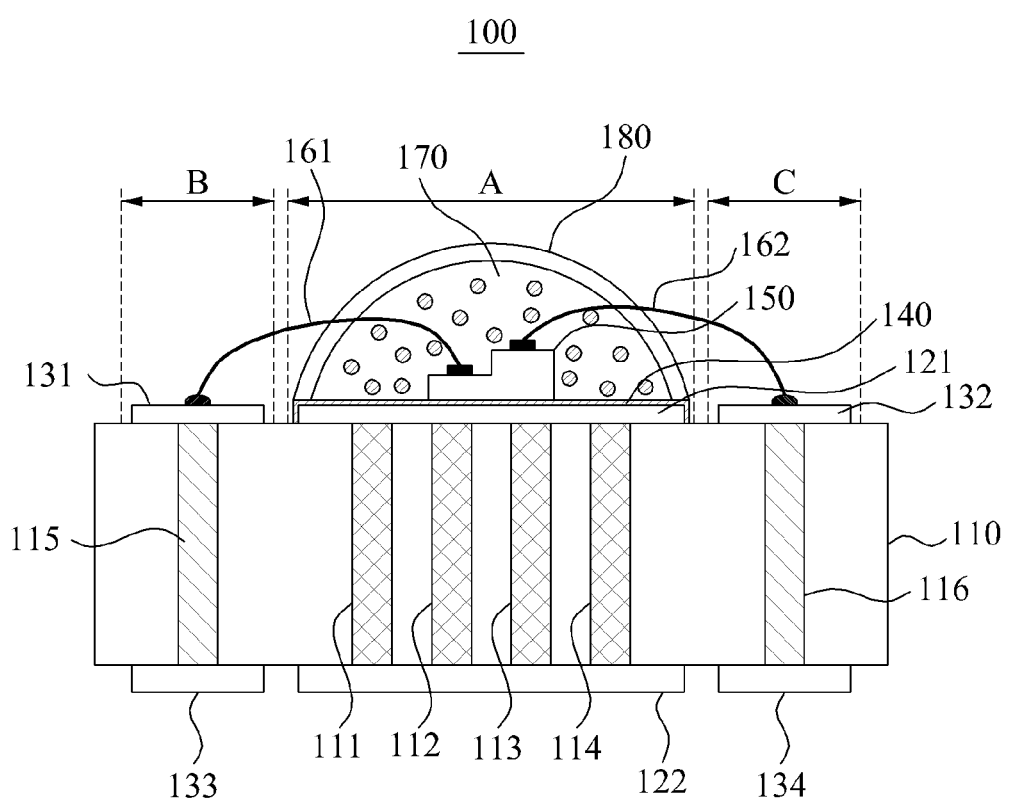
FIG. 1 illustrates a sectional view of a light emitting device (LED) package according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

FIG. 1 illustrates a sectional view of a light emitting device (LED) package 100 according to an embodiment of the present invention. Referring to FIG. 1, the LED package 100 may include a circuit board 110, a first thermal pad 121, a second thermal pad 122, first electrode pads 131 and 132, second electrode pads 133 and 134, a reflection metal layer 140, an LED 150, a phosphor layer 170, and a molding portion 180.

The circuit board 110 may be a metal core printed circuit board (PCB) or a Flame Resistant (FR) 4 substrate. The FR4 substrate may be a core-type substrate formed by coating a PCB, a ceramic substrate, or various other types of semiconductor substrate, with the FR4. Besides the FR4 substrate, a substrate containing FR1, FR2, and FR3 may be used as the circuit board 110.

The circuit board 110 includes an upper surface and a lower surface. Also, the circuit board 110 may include at least one device region A, and a plurality of electrode regions, for example, a first electrode region B and a second electrode region C.

The circuit board 110 includes at least one first thermal vias 111, 112, 113, and 114 exposed through the upper surfaces and the lower surfaces in the device region A. In addition, the circuit board 110 includes a plurality of second thermal vias 115 and 116 exposed through the upper surfaces and the lower surfaces in the first electrode region B and the second electrode region C.

Referring to FIG. 1, four first thermal vias, for example, the first thermal vias 111, 112, 113, and 114 may be formed in the device region A and exposed through the upper surface and the lower surface of the device region A. Each of the second thermal vias 115 and 116 is disposed in the first electrode region B and the second electrode region C, respectively, and exposed through the upper surfaces and the lower surfaces of the first electrode region B and the second electrode region C.

FIG. 1 shows only as an example a number of the first thermal via 111, 112, 113, and 114, and the second thermal vias 115 and 116. That is, the number of the first thermal vias 111, 112, 113, and 114, and the second thermal vias 115 and 116 may be varied according to surface areas of the device region A and the electrode regions B and C, and size of the first thermal vias 111, 112, 113, and 114, and the second thermal vias 115 and 116.

The first thermal vias 111, 112, 113, and 114 may be used as heat conduction mediums for radiating heat generated from the LED package 100, more specifically from the LED 150, to the outside. Also, the second thermal vias 115 and 116 may be used as heat conduction mediums for radiating heat generated from the first electrode pads 131 and 132. Functions of the first thermal vias 111, 112, 113, and 114 and the second thermal vias 115 and 116 will be described in detail below.

The first thermal pad 121 is bonded to the upper surface of the device region A, and connected to the four first thermal vias 111, 112, 113, and 114 exposed through the upper surface.

The first thermal pad 121 may further include the reflection metal layer 140 on a surface thereof. The reflection metal layer 140 may coat only an upper surface of the first thermal pad 121, or even coat a side surface of the first thermal pad 121 as well as the upper surface. The reflection metal layer 140 may be made of a metal material having an excellent reflectivity. The metal material may contain any one of gold (Au), silver (Ag), and platinum (Pt).

In addition, the reflection metal layer 140 may have a heat radiation characteristic in addition to the reflectivity. In order to increase the heat radiation efficiency, the reflection metal layer 140 may have a thickness in the range of about 0.1 mm to 30 mm. Considering the heat radiation characteristic and size of the LED package, more specifically, the thickness may be within a range of about 10 mm to 15 mm.

The first electrode pads 131 and 132 may be bonded to the upper surface of the first electrode region B and the second electrode region C, being electrically and physically separated from the first thermal pad 121 bonded to the device region A. When bonded to the upper surfaces of the electrode regions B and C, the first electrode pads 131 and 132 are connected to the two second thermal vias 115 and 116 exposed through the upper surfaces of the electrode regions B and C, respectively. That is, the first electrode pad 131 may be connected to the second thermal via 115 exposed through the upper surface of the first electrode region B while the first electrode pad 132 is connected to the second thermal via 116 exposed through the upper surface of the second electrode region C.

The second thermal pad 122 may be bonded to the lower surface of the device region A and connected to the four first thermal vias 111, 112, 113, and 114 exposed through the lower surface of the device region A.

The second electrode pads 133 and 134 are bonded to the lower surfaces of the first electrode region B and the second electrode region C while being electrically and physically separated from the second thermal pad 122 bonded to the device region A. One of the two second electrode pads 133 and 134, that is, the second electrode pad 133 is connected to the second thermal via 115 exposed through the lower surface of the first electrode region B. The other second electrode pad 134 is connected to the second thermal via 116 exposed through the lower surface of the second electrode region C.

The LED 150 may be mounted on the first thermal pad 121 and coated with the reflection metal layer 140. Although FIG. 1 shows a single LED 150 mounted on the first thermal pad 121, the LED 150 may be plural in number.

The LED 150 may be connected to the first electrode pads 131 and 132 through a first wire 161 and a second wire 162 to be electrically connected with an external circuit.

The phosphor layer 170 may cover the LED 150, containing a phosphor to convert wavelength of the light generated from the LED 150. The phosphor of the phosphor layer 10 may be varied according to a wavelength range of the light generated from the LED 150 and a color of the light to be generated by the LED package 100.

For example, when white light is to be embodied by the LED package 100 and when the LED 150 is a blue LED emitting light in a blue wavelength range, the phosphor layer 170 may contain a yellow phosphor. Therefore, the LED package 100 may convert part of the light generated from the LED 150 into light in a yellow wavelength range through the yellow phosphor, and realize the white light by mixing the light of blue wavelength range with the converted light of the yellow wavelength range.

As another example of generating the white light by the LED package 100, when the LED 150 is an ultraviolet (UV) LED generating light in a UV wavelength range, the phosphor layer 170 may contain blue, green, and red phosphors. That is, the LED package 100 may convert the light generated from the LED 150 into lights in blue, green, and red wavelength ranges through the blue, green and red phosphors, and realized the white light by mixing those wavelength-converted lights.

In addition to the phosphor, the phosphor layer 170 may further include a light diffuser. The light diffuser may have a nano particle size, that is, equal to or less than ½ of a particle size of the phosphor. The light diffuser may be a white particle containing any one of $Al_2O_3$, $SiO_2$, and $TiO_2$.

The molding portion 180 may mold the phosphor layer 170 and the LED 150.

Hereinafter, functions of the respective components of the LED package 100 shown in FIG. 1 may be described.

The LED 150 generates heat during the light emitting operation. If the heat is accumulated without being radiated to the outside, the LED 150 may be deteriorated, also deteriorating the function of the phosphor layer 170 that converts the wavelength of the light.

The LED 100 may radiate the heat generated from the LED 150 to the outside through a first heat conduction medium consisting of the first thermal pad 121 and the first thermal vias 111, 112, 113, and 114.

Also, during the light emitting operation of the LED 150, heat may be generated and conducted from the first electrode pads 131 and 132 in electrical connection with the LED 150. Therefore, the LED package 100 may radiate the heat generated and conducted by the first electrode pads 131 and 132 through a second heat conduction medium consisting of the first electrode pads 131 and 132, the second thermal vias 115 and 116, and the second electrode pads 133 and 134.

Accordingly, the LED package 100 may quickly radiate the heat through the first heat conduction medium and the second heat conduction medium without accumulating the heat inside, thereby increasing the overall heat radiation efficiency.

For a higher efficiency of heat radiation, respective components of the first and second heat conduction mediums may include metal having a high thermal conductivity. Specifically, the first thermal vias 111, 112, 113, and 114, the second thermal vias 115 and 116, the first thermal pad 121, the second thermal pad 122, the first electrode pads 131 and 132, and the second electrode pads 133 and 134 may include at least one of metal materials including aluminum (Al), copper (Cu), molybdenum (Mo), tungsten (W), silver (Ag), and solder. Here, the metal materials constituting those components may all be the same metal or different. Other than the aforementioned examples, various other metals having a high thermal conductivity may be used.

When light is generated from the LED 150, loss of the light may occur owing to a light advancing direction. For example, when the LED package 100 shown in FIG. 1 lacks the reflection metal layer 140, the light advancing to the lower surface of the LED package 100 may diffuse by collision with the first thermal pad 121, thereby weakening the light signal, or may be lost by the collision. As a consequence, the heat extraction efficiency of the LED package 100 may be reduced.

However, since the LED package 100 according to the embodiment of the present invention includes the reflection metal layer 140 coating the first thermal pad 121, the light advancing to the lower surface is reflected and extracted through a side surface of the upper surface of the LED 150. Therefore, the light extraction efficiency of the LED package 100 may be increased.

Since the LED package 100 uses a wire bonding LED instead of a flip chip bonding LED, the manufacturing process is simplified and the manufacturing cost is reduced. Accordingly, marketability is increased.

FIGS. 2 through 8 illustrate sectional views describing a manufacturing method of an LED package according to an embodiment of the present invention.

Figure 2:
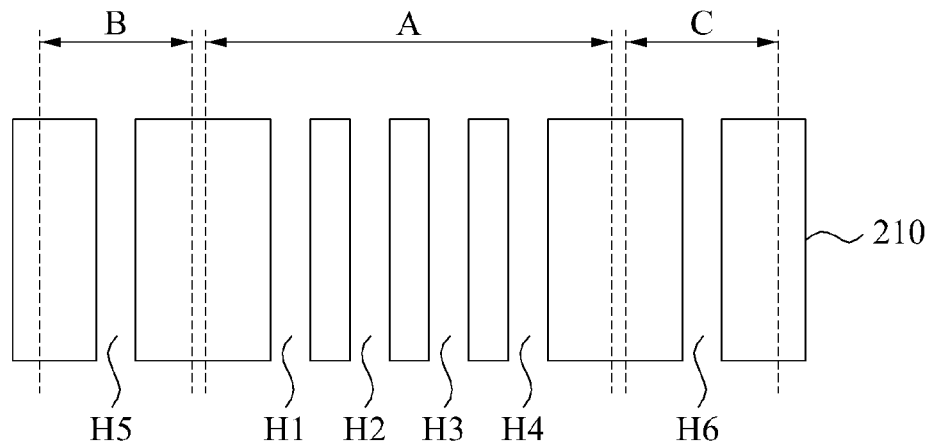
FIGS. 2 through 8 illustrate sectional views describing a manufacturing method of an LED package according to an embodiment of the present invention.
Figure 3:
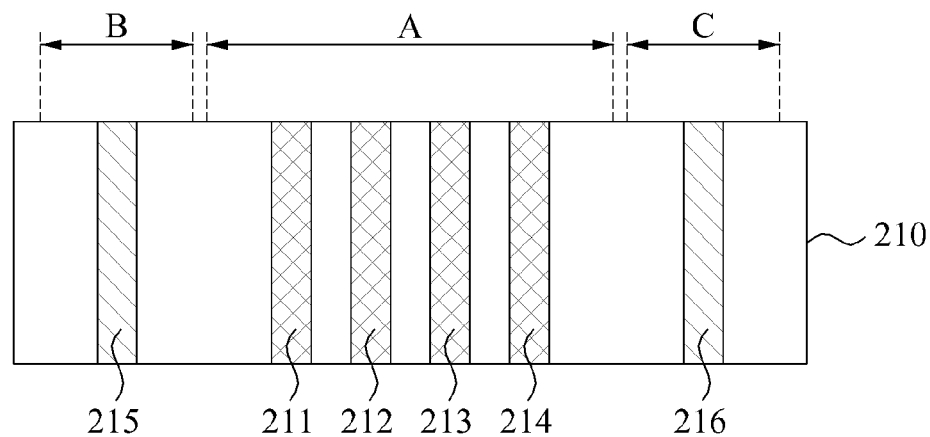

Referring to FIGS. 2 and 3, the LED package manufacturing method includes preparation of a circuit board 210. First, as shown in FIG. 2, the circuit board 210 is divided into one device region A, and a first electrode region B and a second electrode region C disposed on the left and the right of the device region A.

The circuit board 210 may be a metal core PCB or a substrate containing an insulating material. The substrate containing the insulating material refer to a core-type substrate formed by a PCB, a ceramic substrate, or various other types of semiconductor substrate, coated with the insulating material. The insulating material may be one of FR1, FR2, FR3, and FR4.

Four first via holes H1, H2, H3, and H4 are formed in the device region A. Two second via holes H5 and H6 are formed in the first electrode region B and the second electrode region C, respectively. The first via holes H1, H2, H3, and H4 and the second via holes H5 and H6 may be formed by drilling.

Next, as shown in FIG. 3, four first thermal vias 211, 212, 213, and 214 are formed by filling insides of the first via holes H1, H2, H3, and H4 with a metal material. Also, two second thermal vias 215 and 216 are formed by filing insides of the second via holes H5 and H6 with a metal material. The first thermal vias H1, H2, H3, and H4 and the second thermal vias H5 and H6 may include at least one metal material selected from Al, Cu, Mo, W, Ag, and solder.

The first thermal vias 211, 212, 213, and 214 may be exposed through an upper surface and a lower surface of the device region A. The second thermal vias 215 and 216 may be exposed through upper surfaces and lower surfaces of the first electrode region B and the second electrode region C.

Figure 4:
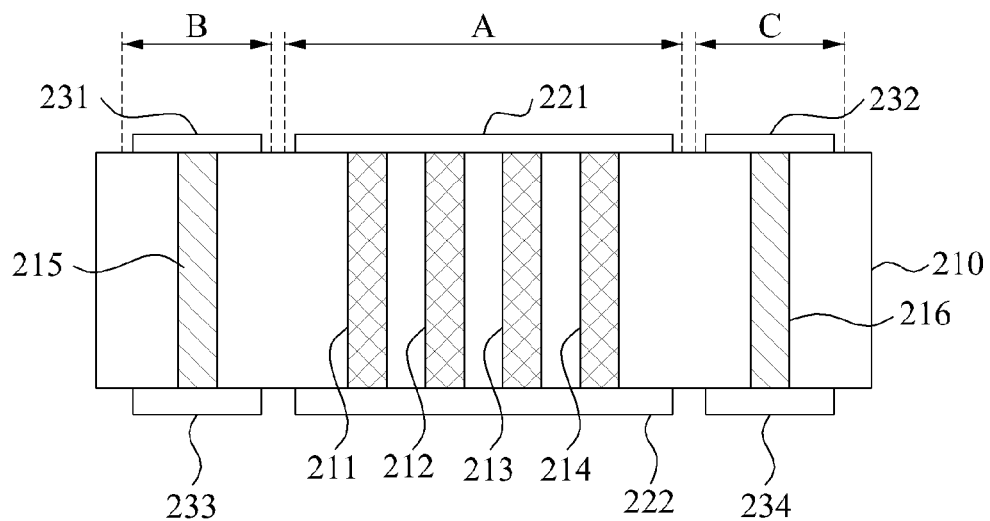

Referring to FIG. 4, the LED package manufacturing method may include forming a first thermal pad 221, a second thermal pad 222, first electrode pads 231 and 232, and second electrode pads 233 and 234.

More specifically, the first thermal pad 221 is formed to be connected with the first thermal vias 211, 212, 213, and 214 exposed through the upper surface of the device region A. The first electrode pads 231 and 232 are formed to be connected with the second thermal vias 215 and 216 exposed through the upper surfaces of the first electrode region B and the second electrode region C.

The first thermal pad 221 and the first electrode pads 231 and 232 may be manufactured by one-time operation. For example, the first thermal pad 221 and the first electrode pads 231 and 232 may be manufactured by vapor-depositing the metal material on the overall upper surface of the circuit board 210 and selectively removing the metal material between the device region A and the electrode regions B and C.

The second thermal pad 222 is formed to be connected to the first thermal vias 211, 212, 213, and 214 exposed through the lower surface of the device region A. The second electrode pads 233 and 234 are formed to be connected to the second thermal vias 215 and 216 exposed through the lower surfaces of the first electrode region B and the second electrode region C.

The second thermal pad 222 and the second electrode pads 233 and 234 may also be manufactured by one-time operation. For example, the second thermal pad 222 and the second electrode pads 233 and 234 may be manufactured by vapor-depositing a metal material on the overall lower surface of the circuit board 210 and selectively removing the metal material between the device region A and the electrode regions B and C.

The first thermal pad 221, the second thermal pad 222, the first electrode pads 231 and 232, and the second electrode pads 233 and 234 may include at least one metal material selected from Al, Cu, Mo, W, Ag, and solder. In this case, the metal materials constituting those components may be all the same or different.

Figure 5:
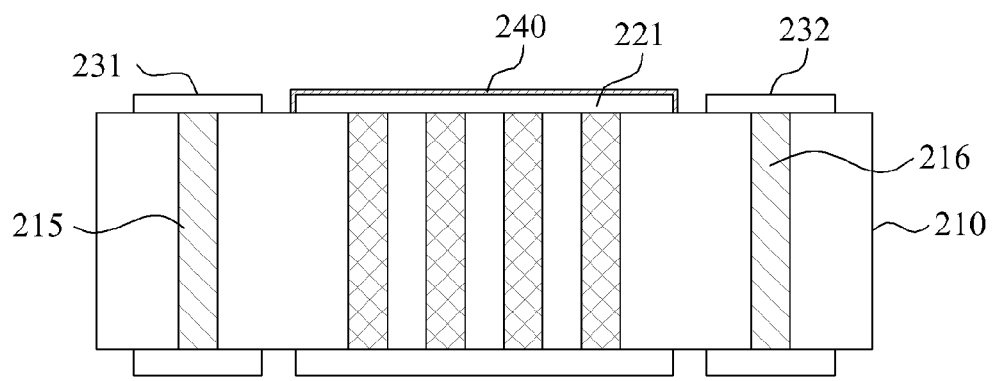

Referring to FIG. 5, the LED package manufacturing method according to the embodiment of the present invention may include coating the first thermal pad 221 with a reflection metal layer 240. The reflection metal layer 240 may be disposed on a surface of the first thermal pad 221 on the circuit board 210 shown in FIG. 4, and formed of any one metal material selected from Au, Ag, and Pt having an excellent high reflectivity. The reflection metal layer 240 may have heat radiation characteristic in addition to the reflectivity. The reflection metal layer 240 may have a thickness in the range of about 0.1 mm to 30 mm. Considering the heat radiation characteristic and size of the LED package, more specifically, the thickness of the reflection metal layer 240 may be within a range of about 10 mm to 15 mm.

Figure 6:
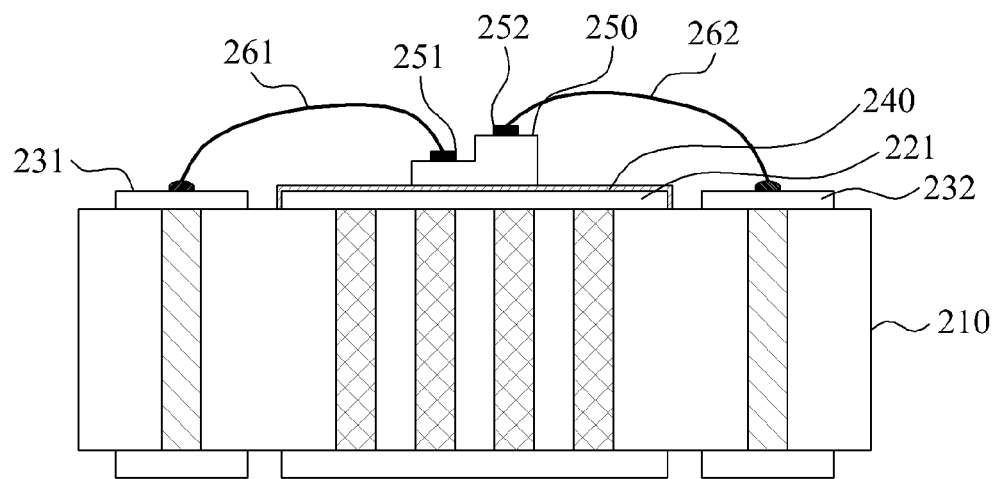

Referring to FIG. 6, the LED package manufacturing method may include mounting an LED 250 on the first thermal pad 221 including the reflection metal layer 240. The LED 250 may have a horizontal structure on which two electrodes 251 and 252 are mounted. The LED 250 may include a nitride-based semiconductor material. After the LED 250 is mounted on the first thermal pad 221, the two electrodes 251 and 252 are connected with two first electrode pads 231 and 232, respectively, through a first wire 261 and a second wire 262. The first wire 261 and the second 262 may be formed of Au.

Figure 7:
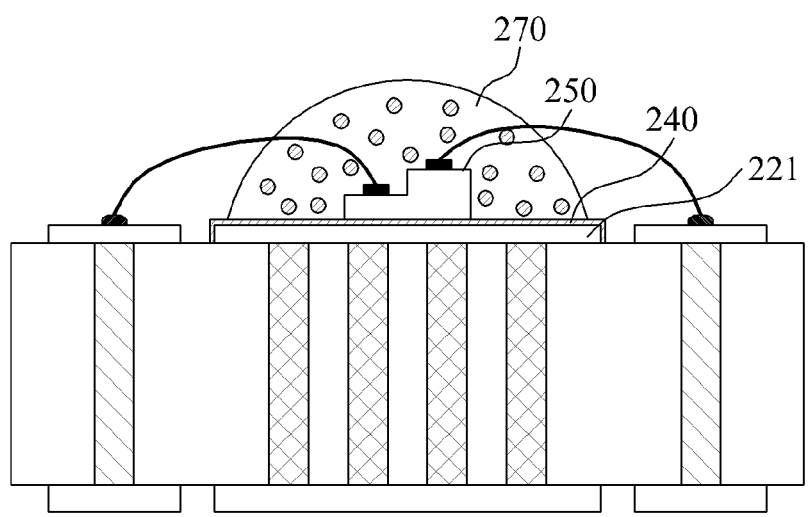

Referring to FIG. 7, the LED package manufacturing method may include applying a phosphor resin 270 to an upper part of the LED 250.

The phosphor resin 270 may be a mixture of silicon resin or epoxy resin, a phosphor for converting wavelength of the light, and a light diffuser. The phosphor resin 270 may contain at least one kind of phosphor according to a wavelength range of the light generated from the LED 250 and a color of the light to be generated by the LED package. For example, the phosphor resin 270 may contain a phosphor such as YAG, TAG, LuAG, and the like. In addition, the phosphor resin 270 may include the light diffuser having a nano particle size, that is, equal to or less than ½ of a particle size of the phosphor. The light diffuser in the form of white particle may be a white particle containing any one of $Al_2O_3$, $SiO_2$, and $TiO_2$.

After the phosphor resin 270 is applied, thermal curing of the phosphor resin 270 may be performed.

Figure 8:
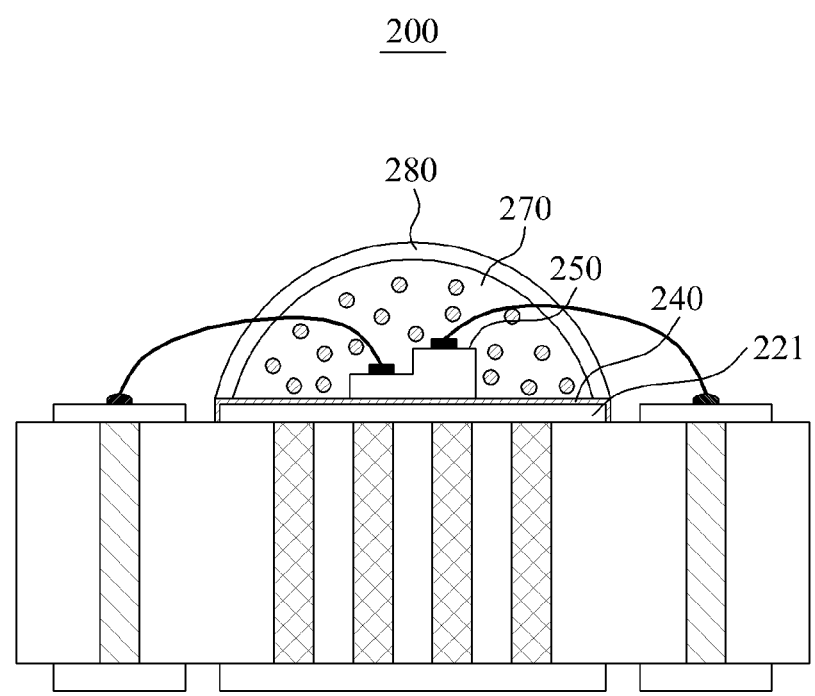

Referring to FIG. 8, the LED package manufacturing method may include applying a molding resin 280 to an upper part of the phosphor resin 270. The molding resin 280 may be formed of silicon resin to protect the LED 250 and the phosphor resin 270 from an external impact.

The phosphor resin 270 and the molding resin 280 may be applied to a dome shape due to surface tension and viscosity. Therefore, the light is refracted at an interface between the molding resin 280 and an air layer, and extracted to the outside. Thus, the light extraction efficiency may be increased.

An LED package 200 manufactured through processes illustrated in FIGS. 2 to 8 may efficiently radiate the heat generated from the light emitting operation of a first heat conduction medium consisting of the first thermal pad 221, the first thermal vias 211, 212, 213, and 214, and the second thermal pad 222, and of a second heat conduction medium consisting of the first electrode pads 231 and 232, the second thermal vias 215 and 216, and the second electrode pads 233 and 234. Accordingly, the heat radiation efficiency of the LED package 200 may be increased.

In accordance with an LED package and a manufacturing method thereof according to the embodiments of the present invention, at least one first thermal via is formed in a device region of a circuit board and a plurality of second thermal vias are formed in an electrode region of the circuit board. Therefore, heat generated from an LED may be effectively radiated.

In addition, since a first thermal pad is formed in a device region of the circuit board and a reflection metal layer is formed on a surface of the first thermal pad, the extraction efficiency for light generated from an LED may be increased.

Also, since an LED is electrically connected with a first electrode pad by wire-bonding not by flip chip bonding, the manufacturing cost of the LED package may be reduced.

Although certain embodiments have been shown and described, it would be appreciated by those skilled in the art that changes may be made in these embodiments without departing from the principles and spirit of the disclosure, the scope of which is defined in the claims and their equivalents.

What is claimed is:

1. A light emitting device (LED) package comprising:
   a circuit board comprising at least one device region, a plurality of electrode regions, a plurality of first thermal vias exposed through an upper surface and a lower surface of the at least one device region, and a plurality of second thermal vias exposed through upper surfaces and lower surfaces of the plurality of electrode regions;
   at least one first thermal pad bonded to the upper surface of the at least one device region and connected to the plurality of first thermal vias;

at least one LED mounted on the at least one first thermal pad;
a phosphor layer disposed on the at least one LED;
a molding unit disposed on the phosphor layer;
a plurality of first electrode pads bonded to the upper surface of the electrode region and connected to the plurality of second thermal vias;
a plurality of wires to electrically connect the at least one LED with the plurality of first electrode pads, and
a reflection metal layer coating a surface of the at least one first thermal pad,
wherein the at least one LED overlies at least one of the first thermal vias,
the phosphor layer surrounds the at least one LED and overlies the first thermal pad, and the phosphor layer does not overlie the first electrode pads,
the circuit board is selected from an FR1 substrate, FR2 substrate, FR3 substrate, and FR4 substrate, and
the reflection metal layer has thickness in the range of about 0.1 mm to 30 mm.

2. The LED package of claim 1, further comprising:
at least one second thermal pad bonded to the lower surface of the at least one device region and connected to the plurality of first thermal vias; and
a plurality of second electrode pads bonded to lower surfaces of the plurality of electrode regions and connected to the plurality of second thermal vias.

3. The LED package of claim 2, wherein the plurality of first thermal vias, the plurality of second thermal vias, the at least one first thermal pad, the at least one second thermal pad, the plurality of first electrode pads, and the plurality of second electrode pads are made of at least one of aluminum (Al), copper (Cu), molybdenum (Mo), tungsten (W), silver (Ag), and solder.

4. The LED package of claim 1, wherein the reflection metal layer is made of any one selected from gold (Au), Ag, and platinum (Pt).

5. The LED package of claim 1, wherein the at least one LED is a blue LED emitting light in a blue wavelength range.

6. A method of manufacturing a light emitting device (LED), the method comprising:
preparing a circuit board comprising at least one device region, a plurality of electrode regions, a plurality of first thermal vias exposed through an upper surface and a lower surface of the at least one device region, and a plurality of second thermal vias exposed through upper surfaces and lower surfaces of the plurality of electrode regions;
forming at least one first thermal pad on the upper surface of the at least one device region to be connected to the plurality of first thermal vias, wherein a reflection metal layer is formed by coating a surface of the at least one thermal pad with a metal material;
forming a plurality of first electrode pads on the upper surface of the electrode region to be connected to the plurality of second thermal vias;
mounting at least one LED on the at least one first thermal pad;
applying a phosphor layer on the at least one LED;
applying a molding unit on the phosphor layer; and
wire-bonding so that the at least one LED is electrically connected with the plurality of first electrode pads,
wherein the at least one LED overlies at least one of the first thermal vias,
the phosphor layer surrounds the at least one LED and overlies the first thermal pad, and the phosphor layer does not overlie the first electrode pads, and
the circuit board is selected from an FR1 substrate, FR2 substrate, FR3 substrate, and FR4 substrate, and
the reflection metal layer has thickness in the range of about 0.1 mm to 30 mm.

7. The method of claim 6, wherein the preparing of the circuit board comprises:
forming a plurality of first via holes on the at least one device region of the circuit board;
forming a plurality of second via holes on the plurality of electrode regions of the circuit board;
forming the plurality of first thermal vias by filling a metal material in the plurality of first via holes; and
forming the plurality of second thermal vias by filling a metal material in the plurality of second via holes.

8. The method of claim 6, further comprising:
forming at least one second thermal pad on the lower surface of the at least one device region to be connected to the plurality of thermal vias; and
forming a plurality of second electrode pads on lower surfaces of the plurality of electrode regions to be connected to the plurality of second thermal vias.

9. The method of claim 6, wherein the at least one LED is a blue LED emitting light in a blue wavelength range.

* * * * *